(12) United States Patent
Jung

(10) Patent No.: US 7,862,991 B2
(45) Date of Patent: Jan. 4, 2011

(54) METHOD FOR FABRICATING RECESS PATTERN IN SEMICONDUCTOR DEVICE

(75) Inventor: Yong-Soon Jung, Ichon-shi (KR)

(73) Assignee: Hynix Seminconductor Inc., Ichon-Shi, Kyoungki-Do (KR)

( * ) Notice: Subject to any disclaimer, the term of this patent is extended or adjusted under 35 U.S.C. 154(b) by 700 days.

(21) Appl. No.: 11/771,143

(22) Filed: Jun. 29, 2007

(65) Prior Publication Data

US 2008/0081296 A1    Apr. 3, 2008

(30) Foreign Application Priority Data

Sep. 29, 2006    (KR) .................... 10-2006-0096509

(51) Int. Cl.
*G03F 7/20* (2006.01)

(52) U.S. Cl. .................. 430/394; 430/311; 430/313

(58) Field of Classification Search ............ 430/311, 430/394, 396, 296
See application file for complete search history.

(56) References Cited

U.S. PATENT DOCUMENTS

2003/0148220 A1*    8/2003    Yang ..................... 430/296

FOREIGN PATENT DOCUMENTS

KR    1020060064891    6/2006

* cited by examiner

*Primary Examiner*—Kathleen Duda
(74) *Attorney, Agent, or Firm*—Lowe Hauptman Ham & Berner LLP

(57) ABSTRACT

A method for fabricating a recess pattern in a semiconductor device includes forming a photoresist layer over a substrate including active regions, performing a first photo-exposure process on the photoresist layer using a photo mask including repeatedly formed line structures and spaces, performing a second photo-exposure process on the photoresist layer using a photo mask exposing the active regions, performing a developing process on regions of the photoresist layer whereon both the first and second photo-exposure processes are performed, and etching the substrate to form recess patterns using the remaining photoresist layer.

10 Claims, 11 Drawing Sheets

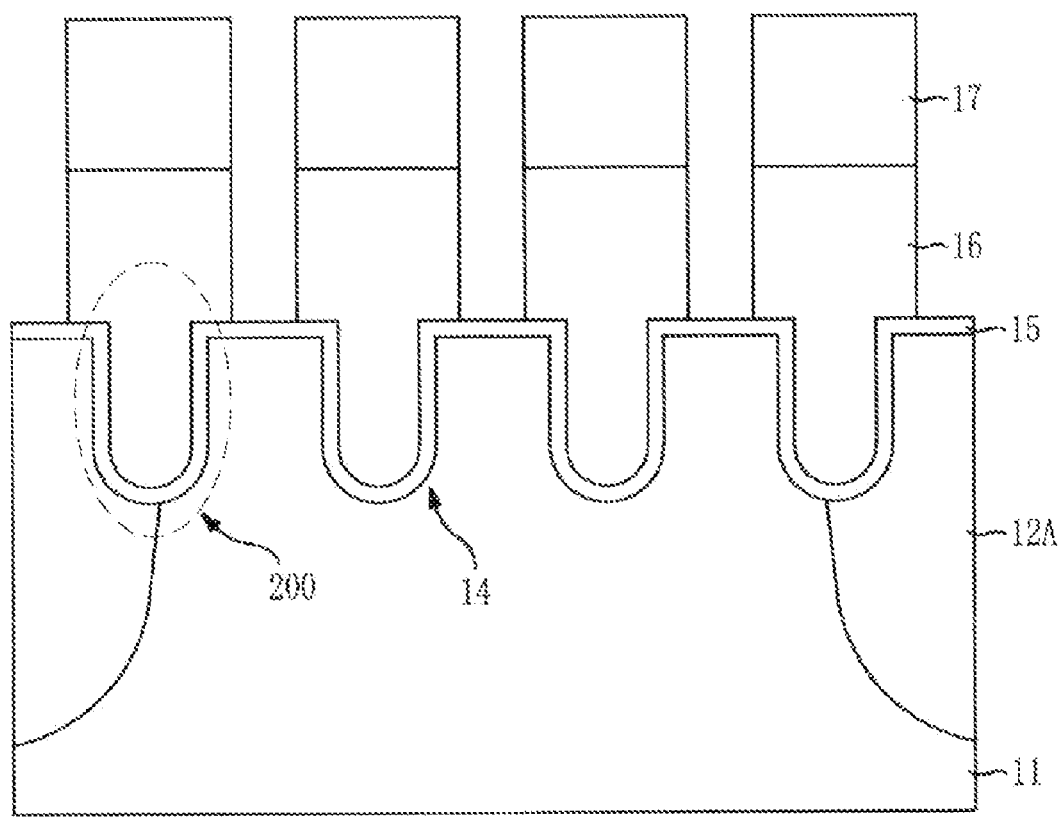

METHOD FOR FABRICATING RECESS PATTERN IN SEMICONDUCTOR DEVICE

CROSS-REFERENCE TO RELATED APPLICATIONS

The present invention claims priority of Korean patent application number 10-2006-0096509, filed on Sep. 29, 2006, which is incorporated by reference in its entirety.

BACKGROUND OF THE INVENTION

The present invention relates to a method for fabricating a semiconductor device, and more particularly, to a method for fabricating a recess pattern in a semiconductor device.

Presently, semiconductor devices have become highly integrated. In a method for forming a typical planar gate in which a gate is formed over a planarized active region, a gate channel length is decreased and an ion implantation doping concentration is increased. Thus, a junction leakage current is generated by an increased electric field. As a result, it has become difficult to secure a refresh characteristic of a device.

To overcome aforementioned limitations, a recess gate process is performed. The recess gate process includes a gate line formation method in which an active region of a substrate is etched into a recess pattern and subsequently, a gate is formed. Using the recess gate process reduces the channel length increase and the ion implantation doping concentration. Thus, the refresh characteristic is improved.

FIG. 1 illustrates a micrographic view of a typical recess pattern in a semiconductor device. An isolation structure 12 is formed in a substrate 11 to define active regions. The active regions are formed in a direction along a major axis. The active regions include line type recess patterns 14 formed in a direction along a minor axis. A method for forming the recess patterns 14 is described in FIGS. 2A to 2C.

FIGS. 2A to 2C illustrate cross-sectional views of a typical method for fabricating a recess pattern in a semiconductor device. The same or like reference numerals used for the descriptions in FIG. 1, FIGS. 2A to 2C, and FIG. 3 represent the same or like elements for convenience of description.

Referring to FIG. 2A, an isolation structure 12 is formed in a substrate 11 to define an active region. A mask pattern 13 is formed over the resultant structure, the mask pattern 13 exposing recess pattern regions. The mask pattern 13 is formed in a line type structure. The mask pattern 13 is formed over the substrate 11 with a uniform spacing distance. The mask pattern 13 is formed over the isolation structure 12 as well as the active region.

Referring to FIG. 2B, the substrate 11 is etched using the mask pattern 13 as an etch mask to form recess patterns 14. Reference numeral 12A refers to a remaining isolation structure 12A.

Referring to FIG. 2C, a gate insulation layer 15 is formed over the surface profile of the resultant structure. Gate patterns are then formed in a manner that a portion of the gate patterns is filled in the recess patterns 14 and the rest of the gate patterns protrude above the substrate 11. Each gate pattern includes a stack structure configured with a gate electrode 16 and a gate hard mask 17.

In the typical method, the recess patterns 14 are formed over both the isolation structure 12 and the active region of the substrate 11. A gate line width has decreased to 70 nm or smaller as the design rule decreases. Thus, patterning for securing a small space of 40 nm or smaller is often required.

The typical method forms the recess patterns 14 in a small space, and thus, a portion of the substrate 11 adjacent to the isolation structure 12 may be damaged (as shown with reference numeral 100 in FIG. 1). Consequently, a coupling 200 results between the active region and the gate pattern. A cell transistor may not operate due to the coupling 200. FIG. 3 illustrates a micrographic view of the coupling 200 generated during the typical method for forming the recess pattern in the semiconductor device.

Furthermore, it may be difficult to embody a pattern having a small width, e.g., ranging from 20 nm to 40 nm, due to a lack of resolution of a photoresist pattern. Such a limitation causes a device process to become more difficult to perform and diminishes mass producibility due to the decreased process margin.

SUMMARY OF THE INVENTION

Embodiments of the present invention are directed to provide a method for fabricating a recess pattern in a semiconductor device, which can decrease undesirable events caused by a coupling between an active region and a gate pattern while forming a recess pattern due to a decreased design rule. Also, a decrease in mass producibility caused by a difficult device process and a small process margin can be reduced.

In accordance with an aspect of the present invention, there is provided a method for fabricating a recess pattern in a semiconductor device, including: forming a photoresist layer over a substrate including active regions; performing a first photo-exposure process on the photoresist layer using a photo mask including repeatedly formed line structures and spaces; performing a second photo-exposure process on the photoresist layer using a photo mask exposing the active regions; performing a developing process on regions of the photoresist layer whereon both the first and second photo-exposure processes are performed; and etching the substrate to form recess patterns using the remaining photoresist layer.

BRIEF DESCRIPTION OF THE DRAWINGS

FIGS. 2A to 2C illustrate cross-sectional views of a typical method for fabricating a recess pattern in a semiconductor device.

DESCRIPTION OF SPECIFIC EMBODIMENTS

Embodiments of the present invention relate to a method for fabricating a recess pattern in a semiconductor device.

Figure 1:
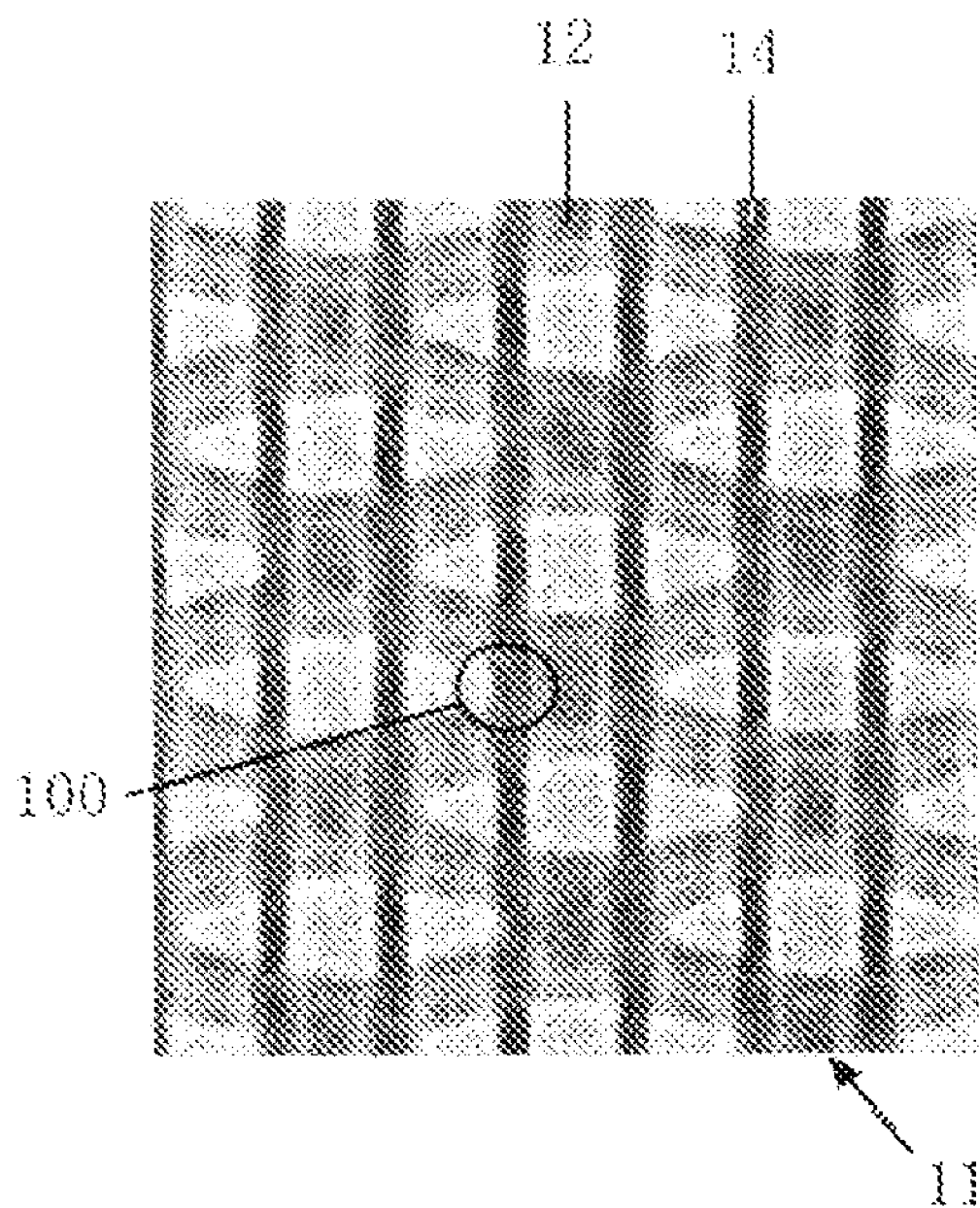
FIG. 1 illustrates a micrographic view of a typical recess pattern in a semiconductor device.
Figure 2A:
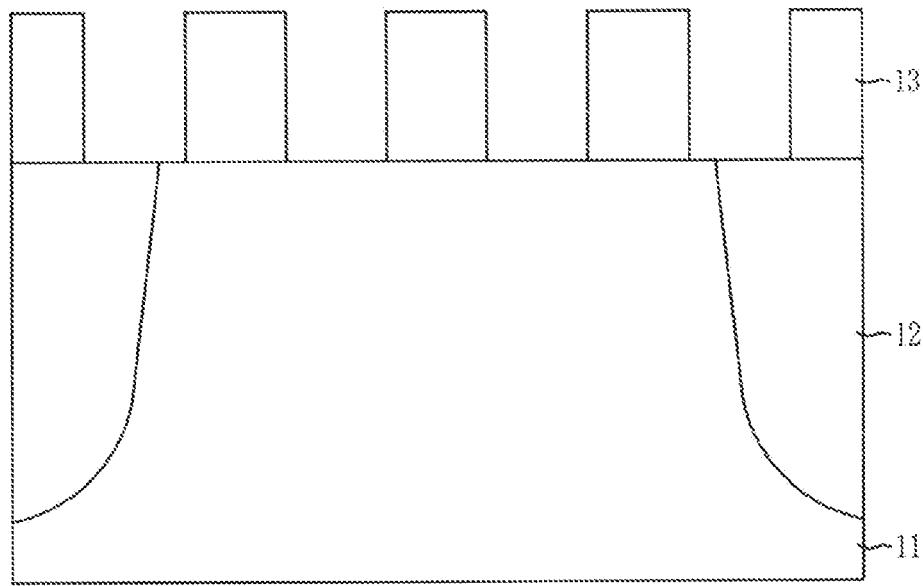
Figure 2B:
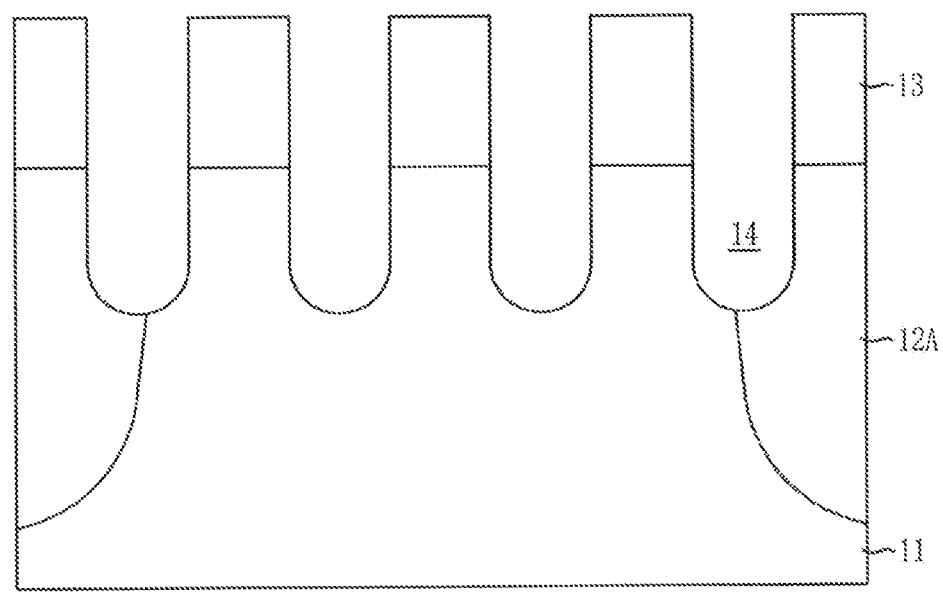
Figure 3:
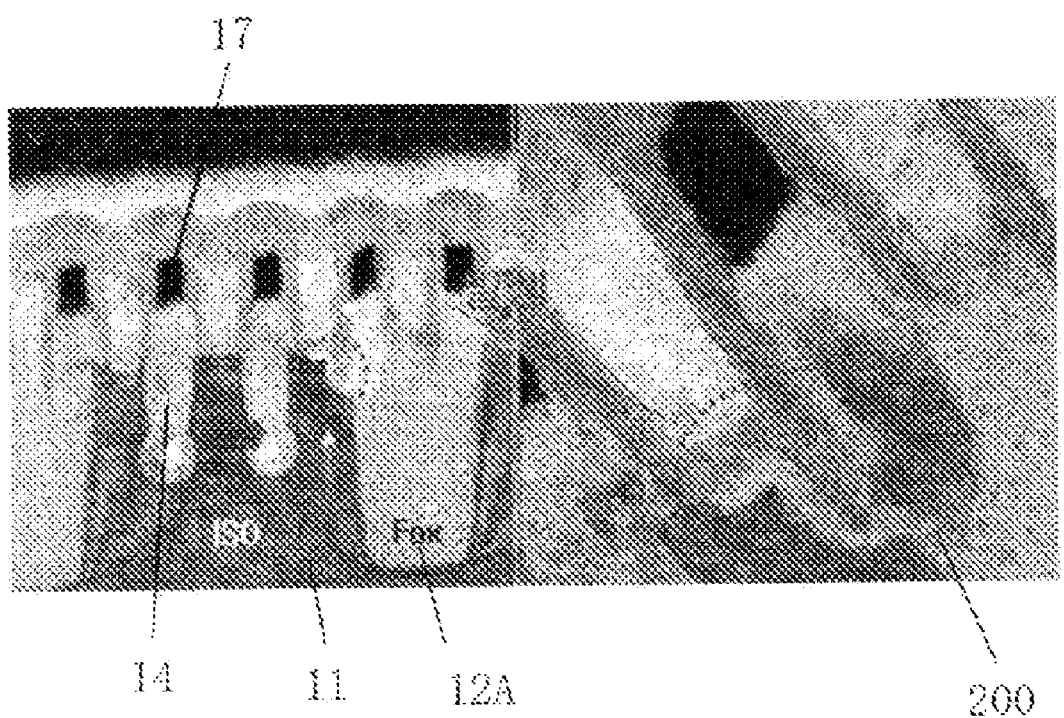
FIG. 3 illustrates a micrographic view of a typical recess gate in a semiconductor device.
Figure 4A:
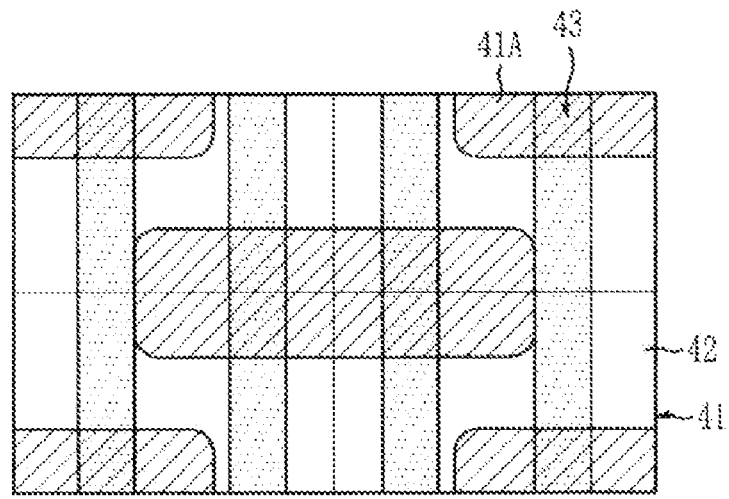
FIGS. 4A and 4B illustrate top views of a two-step photo-exposure process performed on a photoresist layer in accordance with an embodiment of the present invention.
Figure 4B:
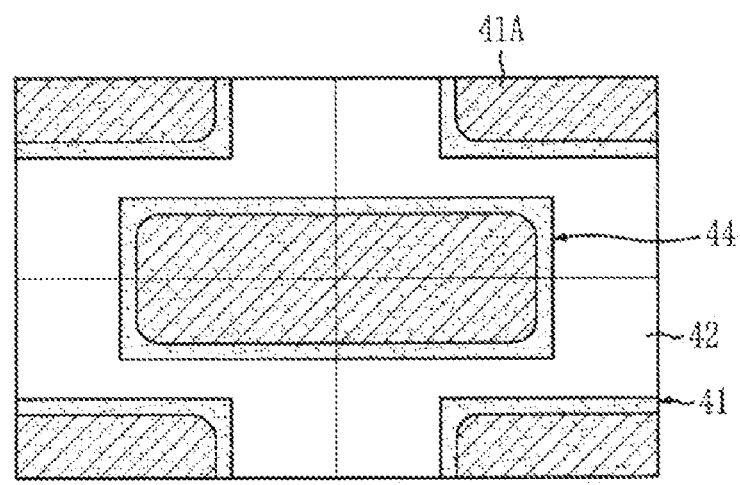

FIGS. 4A and 4B illustrate top views of a two-step photo-exposure process of a photoresist layer in accordance with an embodiment of the present invention.

Referring to FIG. 4A, active regions 41A are defined in a substrate 41 and a photoresist layer (not shown) is formed over the substrate 41. Reference numeral 43 represents first photo-exposure regions 43, and reference numeral 42 represents an isolation structure 42.

The first photo-exposure regions 43 are formed using a photo mask that is substantially the same type as a typical photo mask in which line structures and spaces are repeatedly formed and using approximately 60% to approximately 80% of an energy generally required to develop a photoresist layer.

Referring to FIG. 4B, second photo-exposure regions 44 are shown. The second photo-exposure regions 44 are formed using a photo mask that exposes the active regions 41A of the substrate 41 and using approximately 20% to approximately 40% of an energy generally required to develop a photoresist layer.

Regions sufficed with an optimum energy for photoresist through the aforementioned two-step photo-exposure process, i.e., regions where the first and second photo-exposure regions 43 and 44 overlap, are developed. Thus, patterning on undesired regions is reduced. Consequently, a photoresist pattern for defining recess pattern regions within the active regions 41A of the substrate 41 is formed.

FIGS. 5A to 5F illustrate cross-sectional views of a recess pattern in a semiconductor device in accordance with an embodiment of the present invention. FIGS. 6A to 6F illustrate top views of a recess pattern in a semiconductor device in accordance with the embodiment of the present invention. The same or like reference numerals throughout the various embodiments of the present invention represent the same or like elements in different drawings for convenience of description.

Figure 5A:
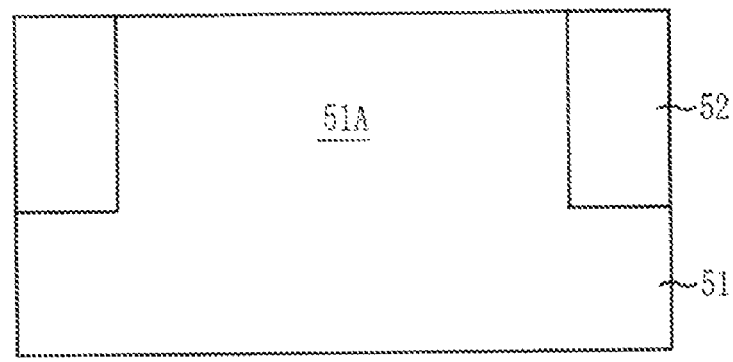
FIGS. 5A to 5F illustrate cross-sectional views of a recess pattern in a semiconductor device in accordance with an embodiment of the present invention.
Figure 6A:
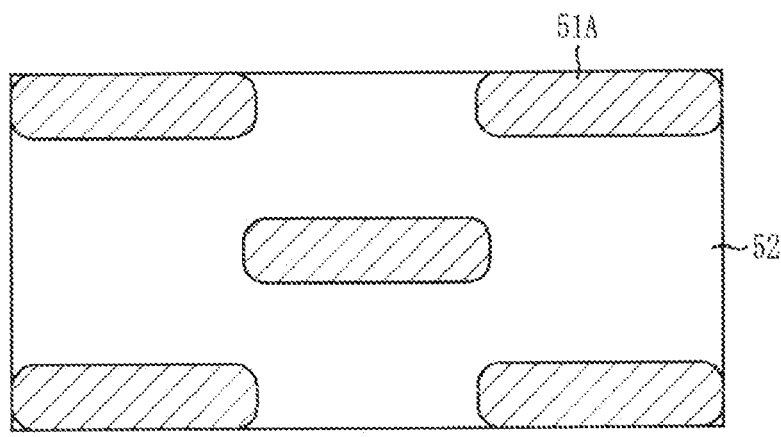
FIGS. 6A to 6F illustrate top views of a recess pattern in a semiconductor device in accordance with an embodiment of the present invention.

Referring to FIGS. 5A and 6A, an isolation structure 52 is formed in a substrate 51. The isolation structure 52 defines active regions 51A. The isolation structure 52 is formed by selectively etching the substrate 51 to form trenches, forming an insulation layer filled in the trenches, and planarizing the insulation layer. The isolation structure 52 is formed to a larger depth than a depth of subsequent recess patterns.

Figure 5B:
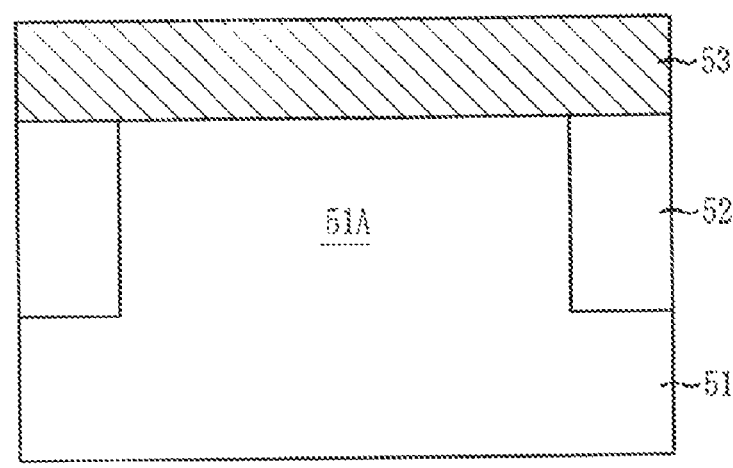
Figure 6B:
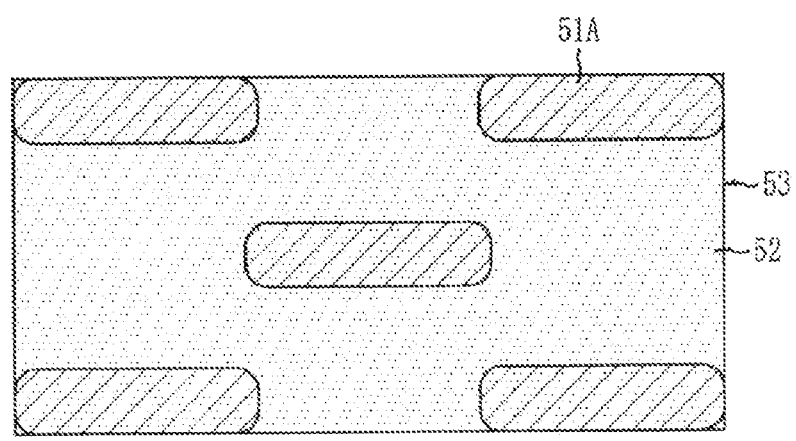

Referring to FIGS. 5B and 6B, a hard mask layer 53 is formed over the substrate 51. The hard mask layer 53 is formed for use as a hard mask during a subsequent recess pattern etch process. For instance, the hard mask layer 53 includes polysilicon. The hard mask layer 53 is illustrated as being transparent for better understanding of the structure.

Figure 5C:
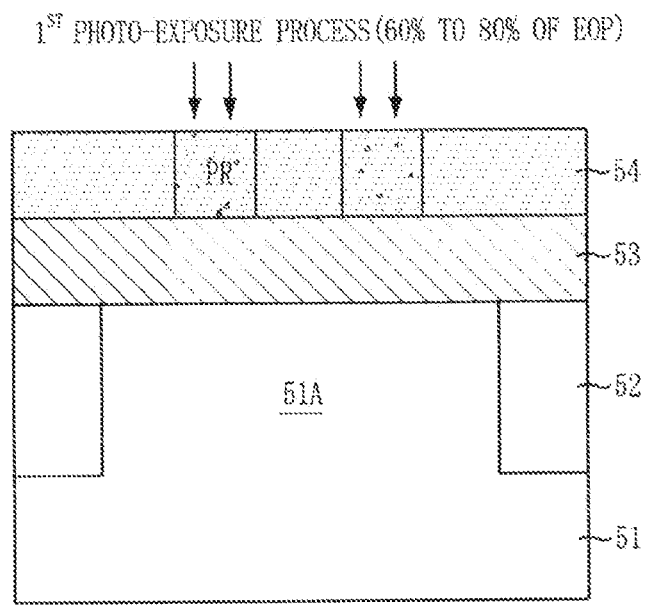
Figure 6C:
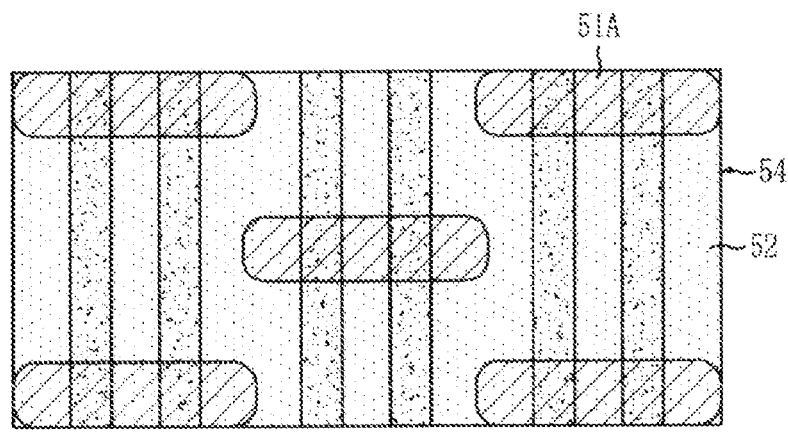

Referring to FIGS. 5C and 6C, a photoresist layer 54 is formed over the hard mask layer 53. The photoresist layer 54 is illustrated as being transparent for better understanding of the structure. A first photo-exposure process is performed on the photoresist layer 54. The first photo-exposure process includes using a line and space type photo mask and using approximately 60% to approximately 80% of an optimum energy (Eop) for photoresist, i.e., an energy generally required to develop a photoresist layer. The line and space type photo mask includes repeatedly formed line structures and spaces. The first photo-exposure process gives an activation energy to the photoresist layer 54. An exposure source for performing the first photo-exposure process may include krypton fluoride (KrF), argon fluoride (ArF), fluorine ($F_2$), or E-beam.

Figure 5D:
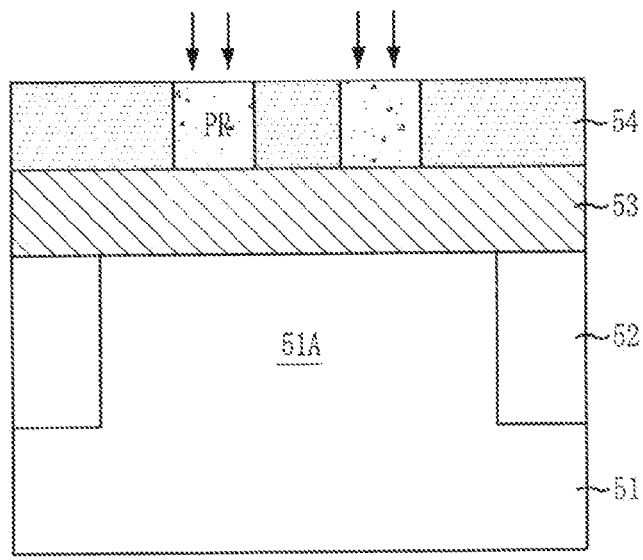
Figure 6D:
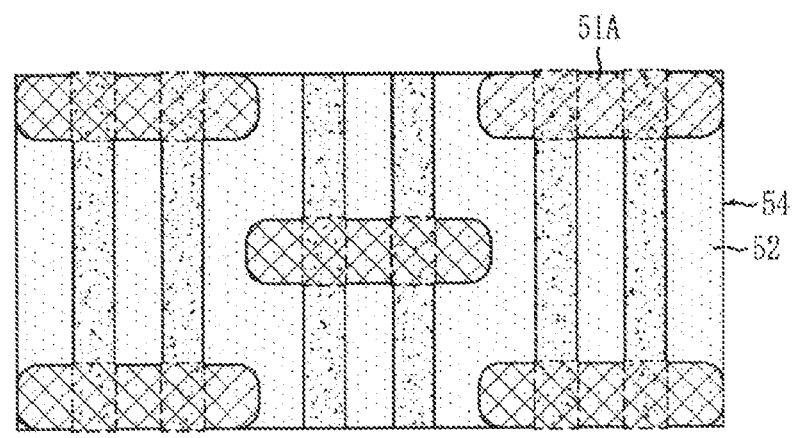

Referring to FIGS. 5D and 6D, a second photo-exposure process is performed over the photoresist layer 54 after the first photo-exposure process is performed. The second photo-exposure process includes using a photo mask which exposes the active regions 51A of the substrate 51 and using approximately 20% to approximately 40% of an optimum energy (Eop) for photoresist, i.e., an energy generally required to develop a photoresist layer. An exposure source for performing the second photo-exposure process may include KrF, ArF, $F_2$, or E-beam.

Figure 5E:
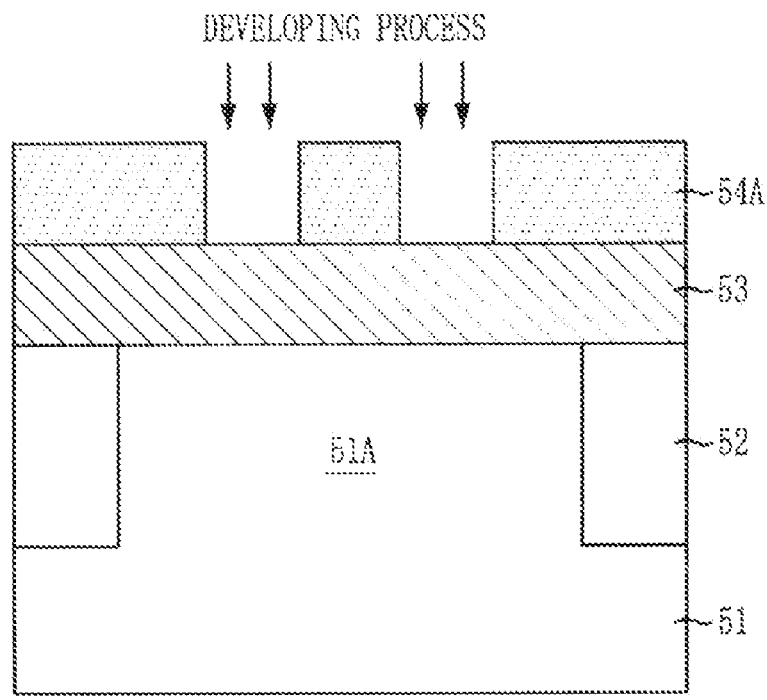
Figure 6E:
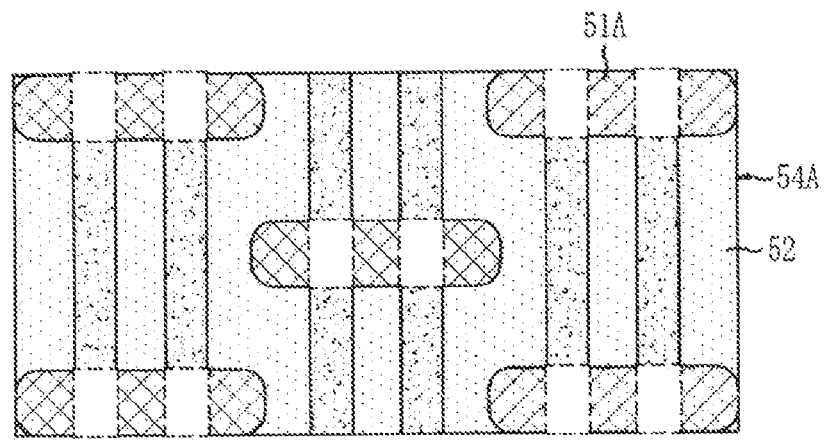

Referring to FIGS. 5E and 6E, a developing process is performed on the resultant structure to form a photoresist pattern 54A defining recess regions. The photoresist pattern 54A exposes the recess regions within the active regions 51A of the substrate 51 because regions sufficed with the optimum energy for photoresist during the first and second photo-exposure processes are developed.

Figure 5F:
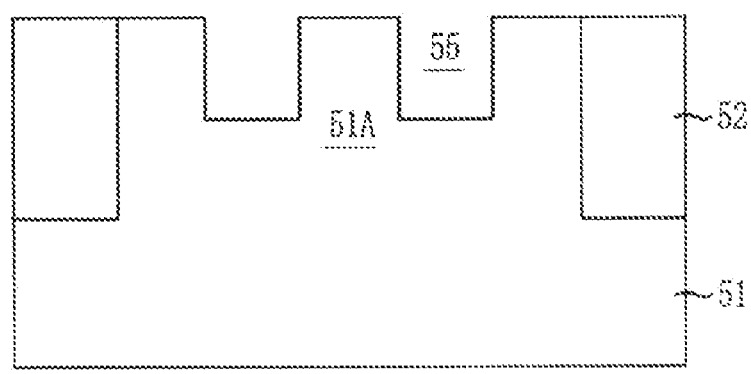
Figure 6F:
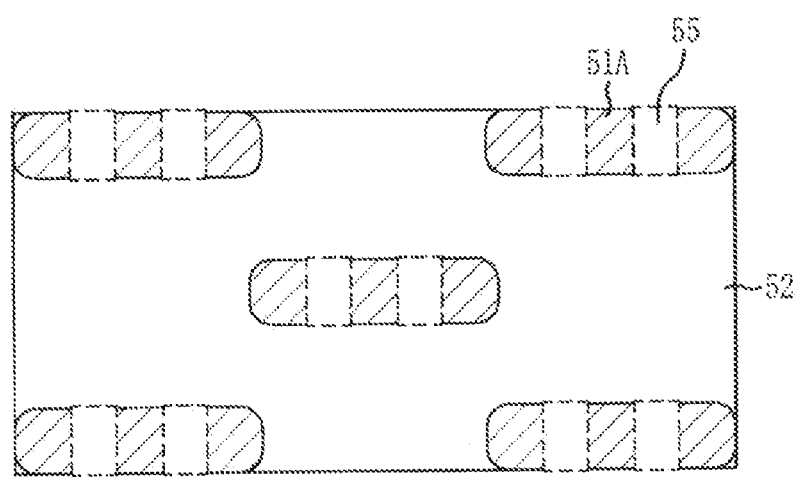

Referring to FIGS. 5F and 6F, the hard mask layer 53 is etched using the photoresist pattern 54A as an etch mask. The substrate 51 is etched to form recess patterns 55 using the etched hard mask layer 53 as an etch mask. The etched hard mask layer 53 and the photoresist pattern 54A are removed.

Although not illustrated, a Vt screen oxidation process and a well/channel formation process are performed. Gate patterns including gate oxide layer, gate electrodes, and gate hard masks are formed to form a cell transistor of a recess gate.

The recess patterns 55 are formed within the active regions 51A of the substrate 51 by performing the two-step photo-exposure process, i.e., the first and second photo-exposure processes, on the photoresist layer 54 to form the photoresist pattern 54A defining the recess regions in the active regions 51A of the substrate 51. Thus, damages on the active regions 51A of the substrate 51 adjacent to the isolation structure 52 may be substantially reduced. Thus, undesired couplings between the active regions 51A of the substrate 51 and the subsequent gate patterns may be decreased even after the gate patterns are formed.

In accordance with the embodiment of the present invention, the photoresist pattern 54A defining the recess regions is formed within the active regions 51A of the substrate 51 by performing the two photo-exposure process on the photoresist layer 54. Also, the recess patterns 55 are formed using the photoresist pattern 54A as a mask. Thus, damages on the active regions 51A of the substrate 51 adjacent to the isolation structure 52 may be substantially reduced.

In accordance with the embodiment of the present invention, damage on the active regions of the substrate is substantially reduced when forming the recess patterns, and the patterning margin is secured. Thus, device reliability and a process margin are maintained. That is, undesired cell damages may be substantially decreased, the process margin may be increased, and limitations related to an etch process may be solved by forming the photoresist pattern using the two-step photo-exposure process and one developing process, without adding an etch process. Thus, a refresh characteristic of the device may be secured and a product development period may be shortened.

While the present invention has been described with respect to the specific embodiments, it will be apparent to those skilled in the art that various changes and modifications may be made without departing from the spirit and scope of the invention as defined in the following claims.

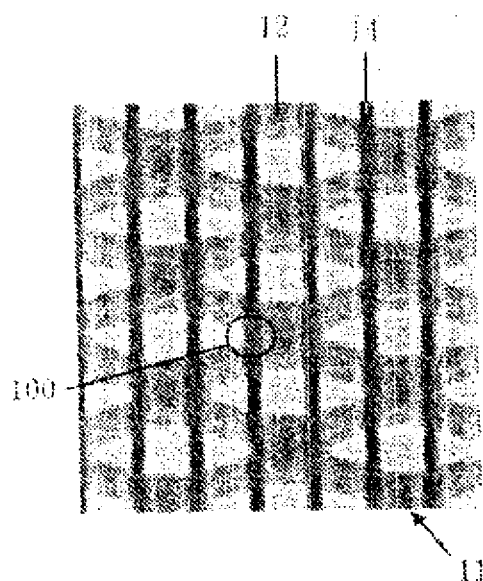

What is claimed is:

1. A method for fabricating a recess pattern in a semiconductor device, the method comprising:

forming a photoresist layer over a substrate including active regions;

performing a first photo-exposure process on the photoresist layer using a photo mask including repeatedly formed line structures and spaces;

performing a second photo-exposure process on the photoresist layer using a photo mask only exposing the active regions;

performing a developing process on regions of the photoresist layer whereon both the first and second photo-exposure processes are performed; and etching the substrate to form recess patterns using the remaining photoresist layer.

2. The method of claim 1, wherein performing the first photo-exposure process and performing the second photo-exposure process comprise using different energy levels from each other.

3. The method of claim 2, wherein performing the first photo-exposure process comprises using approximately 60% to approximately 80% of an optimum energy for photoresist.

4. The method of claim 2, wherein performing the second photo-exposure process comprises using approximately 20% to approximately 40% of an optimum energy for photoresist.

5. The method of claim 1, wherein performing the first photo-exposure process comprises using an exposure source including krypton fluoride (KrF), argon fluoride (ArF), fluorine (F2), or E-beam.

6. The method of claim 1, wherein performing the second photo-exposure process comprises using an exposure source including KrF, ArF, F2, or E-beam.

7. A method of fabricating a recess gate in a semiconductor, the method comprising:
    forming a substrate including active regions defined by an isolation structure;
    forming a hardmask layer and a photoresist layer over the active regions and the isolation structure;
    performing a first photo exposure process on the photoresist layer using a mask of line type openings, each line type opening crossing over the active regions;
    performing a second photo exposure process on the photoresist layer using a second mask having openings only corresponding to the active regions;
    performing a developing process on regions of the photoresist layer whereon both the first and second photo-exposure processes are performed;
    etching the active regions to form recess patterns using the remaining photoresist layer and the hardmask layer; and
    forming recess gates over the recess patterns.

8. The method of claim 7, wherein performing the first photo-exposure process and performing the second photo-exposure process comprise using different energy levels from each other.

9. The method of claim 8, wherein performing the first photo-exposure process comprises using approximately 60% to approximately 80% of an optimum energy for photoresist.

10. The method of claim 8, wherein performing the second photo-exposure process comprises using approximately 20% to approximately 40% of an optimum energy for photoresist.

* * * * *

UNITED STATES PATENT AND TRADEMARK OFFICE
CERTIFICATE OF CORRECTION

PATENT NO.        : 7,862,991 B2
APPLICATION NO.   : 11/771143
DATED             : January 4, 2011
INVENTOR(S)       : Yong-Soon Jung It is certified that error appears in the above-identified patent and that said Letters Patent is hereby corrected as shown below:

Title Page

Please correct the first page of the patent to include the missing illustrative figure/drawing on the first page of the Patent in its respective place:

Signed and Sealed this
Twenty-seventh Day of September, 2011

David J. Kappos
*Director of the United States Patent and Trademark Office*

(12) United States Patent
Jung

(10) Patent No.: US 7,862,991 B2
(45) Date of Patent: Jan. 4, 2011

(54) METHOD FOR FABRICATING RECESS PATTERN IN SEMICONDUCTOR DEVICE

(75) Inventor: Yong-Soon Jung, Ichon-shi (KR)

(73) Assignee: Hynix Semiconductor Inc., Ichon-Shi, Kyoungki-Do (KR)

(*) Notice: Subject to any disclaimer, the term of this patent is extended or adjusted under 35 U.S.C. 154(b) by 700 days.

(21) Appl. No.: 11/771,143

(22) Filed: Jun. 29, 2007

(65) Prior Publication Data
US 2008/0081296 A1 Apr. 3, 2008

(30) Foreign Application Priority Data
Sep. 29, 2006 (KR) .......... 10-2006-0096509

(51) Int. Cl.
G03F 7/20 (2006.01)
(52) U.S. Cl. .......... 430/394; 430/311; 430/313
(58) Field of Classification Search .......... 430/311, 430/394, 396, 296
See application file for complete search history.

(56) References Cited

U.S. PATENT DOCUMENTS
2003/0148220 A1* 8/2003 Yang .......... 430/296

FOREIGN PATENT DOCUMENTS
KR 1020060064891 6/2006

* cited by examiner

Primary Examiner—Kathleen Duda
(74) Attorney, Agent, or Firm—Lowe Hauptman Ham & Berner LLP

(57) ABSTRACT

A method for fabricating a recess pattern in a semiconductor device includes forming a photoresist layer over a substrate including active regions, performing a first photo-exposure process on the photoresist layer using a photo mask including repeatedly formed line structures and spaces, performing a second photo-exposure process on the photoresist layer using a photo mask exposing the active regions, performing a developing process on regions of the photoresist layer whereon both the first and second photo-exposure processes are performed, and etching the substrate to form recess patterns using the remaining photoresist layer.

10 Claims, 11 Drawing Sheets